(12) United States Patent
Qu

(10) Patent No.: US 11,714,353 B2
(45) Date of Patent: Aug. 1, 2023

(54) MASK AND METHOD OF MANUFACTURING THE SAME, EVAPORATION APPARATUS AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventor: Lianjie Qu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 641 days.

(21) Appl. No.: 16/429,244

(22) Filed: Jun. 3, 2019

(65) Prior Publication Data
US 2020/0150530 A1 May 14, 2020

(30) Foreign Application Priority Data
Nov. 12, 2018 (CN) .......................... 201811338966.0

(51) Int. Cl.
*G03F 7/00* (2006.01)
*C23C 14/04* (2006.01)
(Continued)

(52) U.S. Cl.
CPC .......... *G03F 7/0035* (2013.01); *C23C 14/042* (2013.01); *G03F 7/2018* (2013.01); *H10K 71/166* (2023.02)

(58) Field of Classification Search
CPC ......... G03F 7/42; G03F 7/0035; G03F 7/2018
See application file for complete search history.

(56) References Cited

U.S. PATENT DOCUMENTS 10,604,833 B2  3/2020  Bai
2016/0160339 A1* 6/2016  Han .................. G03F 7/164
                                              430/320

FOREIGN PATENT DOCUMENTS

CN   102854668   1/2013
CN   103205675   7/2013
(Continued)

OTHER PUBLICATIONS

Chinese Office Action dated May 8, 2020 corresponding Chinese Patent Application No. 201811338966.0; 15 pages.

*Primary Examiner* — Daborah Chacko-Davis
(74) *Attorney, Agent, or Firm* — Leason Ellis LLP (57) ABSTRACT

A mask and a method of manufacturing the same, an evaporation apparatus and a display device are provided. The method includes forming a first photoresist pattern on a substrate, the first photoresist pattern including a plurality of photoresist structures, each photoresist structure including a first surface away from the substrate and a second surface near the substrate, and the size of the first surface being smaller than that of the second surface; forming a metal layer on the substrate with the first photoresist pattern, the metal layer including a plurality of recessed regions and a plurality of raised regions; forming a second photoresist pattern in the recessed regions, an orthographic projection of the second photoresist pattern on the metal layer overlapping with the recessed regions; removing regions of the metal layer not covered by the second photoresist pattern, the second photoresist pattern, the substrate and the first photoresist pattern mask.

6 Claims, 7 Drawing Sheets

(51) Int. Cl.
    *G03F 7/20*     (2006.01)
    *H10K 71/16*     (2023.01)

(56) References Cited

FOREIGN PATENT DOCUMENTS

| | | |
|---|---|---|
| CN | 105568217 | 5/2016 |
| CN | 105951040 | 9/2016 |
| CN | 107699852 | 2/2018 |
| KR | 1020180049463 | 5/2018 |

* cited by examiner

Mask

FIG. 14

MASK AND METHOD OF MANUFACTURING THE SAME, EVAPORATION APPARATUS AND DISPLAY DEVICE

CROSS REFERENCE TO RELATED APPLICATIONS

The present application claims the benefits of the priority of Chinese patent application No. 201811338966.0 entitled "Mask and Method of Manufacturing the Same, Evaporation Apparatus and Display Device" filed to CNIPA on Nov. 12, 2018, the entire text of which is incorporated herein by reference.

TECHNICAL FIELD

Embodiments of the disclosure relate to a mask and a method of manufacturing the same, an evaporation apparatus and a display device.

BACKGROUND

An organic light emitting diode (OLED) display device has a plurality of OLED units, each OLED unit includes an organic light emitting layer and electrodes or the like positioned on two sides of the organic light emitting layer. The OLED display device relies on the electrodes to drive the organic light-emitting layer to emit light to realize image display. In the process of manufacturing OLED display devices, structures, such as electrodes and organic light emitting layers can be fabricated by an evaporation apparatus.

SUMMARY

An embodiment of the disclosure provides a mask, a method of manufacturing the same, an evaporation apparatus and a display device.

According to at least one embodiment of the present disclosure, a method of manufacturing a mask is provided, comprising: A method of manufacturing a mask, comprising: providing a substrate; forming a first photoresist pattern on the substrate, the first photoresist pattern comprising a plurality of photoresist structures arranged in an array, each photoresist structure comprising a first surface far away from the substrate and a second surface near the substrate, and a size of the first surface being smaller than a size of the second surface; forming a metal layer covering the first photoresist pattern on the substrate formed with the first photoresist pattern, the metal layer comprising a plurality of recessed regions and a plurality of raised regions, the plurality of raised regions corresponding to the plurality of photoresist structures one to one, and the recessed regions being regions on the metal layer other than the raised regions; forming a second photoresist pattern in the recessed regions of the metal layer, an orthographic projection of the second photoresist pattern on the metal layer overlapping with the recessed region; and removing a region not covered by the second photoresist pattern, the second photoresist pattern, the substrate and the first photoresist pattern on the metal layer to obtain a mask, the mask comprising a plurality of evaporation openings, each evaporation opening comprising two evaporation sub-openings, each evaporation sub-opening comprising a first opening and a second opening, a size of the first opening being smaller than a size of the second opening, the first openings of the two evaporation sub-openings of each evaporation opening being overlapped, and the second openings being respectively positioned on different layouts of the mask.

For example, the forming of the second photoresist pattern in the recessed region of the metal layer comprises: forming the second photoresist pattern in the recessed regions of the metal layer by an ink jet printing process or a coating process.

For example, forming a conductive adhesive layer covering the first photoresist pattern on the substrate formed with the first photoresist pattern before forming the metal layer covering the first photoresist pattern on the substrate formed with the first photoresist pattern; the forming of the metal layer covering the first photoresist pattern on the substrate formed with the first photoresist pattern comprises: forming the metal layer covering the conductive adhesion layer on the substrate on which the conductive adhesion layer is formed by an electroforming process; and after forming the second photoresist pattern in the recessed region of the metal layer, removing the conductive adhesion layer.

For example, each evaporation opening comprises a first evaporation sub-opening and a second evaporation sub-opening, the removing of the region on the metal layer not covered by the second photoresist pattern, the second photoresist pattern, the substrate and the first photoresist pattern comprises: removing a region on the metal layer not covered by the second photoresist pattern by a wet etching process to form a first evaporation sub-opening layer on the metal layer, the first evaporation sub-opening layer comprising a plurality of first evaporation sub-openings corresponding to the plurality of photoresist structures one to one; removing the second photoresist pattern by a photoresist stripping process; stripping the substrate; and removing the first photoresist pattern by a photoresist stripping process to form a second evaporation sub-opening layer on the metal layer, the second evaporation sub-opening layer comprising a plurality of second evaporation sub-openings corresponding to the plurality of photoresist structures one to one.

For example, the removing of the conductive adhesive layer comprises: after removing the region on the metal layer not covered by the second photoresist pattern and before removing the second photoresist pattern, removing the region on the conductive adhesive layer not covered by the metal layer by a wet etching process; and after removing the first photoresist pattern, removing the remaining conductive adhesion layer by a wet etching process.

For example, the conductive adhesive layer is made of at least one of metallic silver and metallic molybdenum.

For example, the metal layer has a thickness ranging from about 5 microns to about 50 microns, and a ratio of thickness of the first photoresist pattern to the thickness of the metal layer ranges from about 1/3 to about 2/3.

For example, the plurality of recessed regions and the plurality of raised regions are arranged alternately.

At least one embodiment provides a mask manufactured by the method, wherein the mask comprises a plurality of evaporation openings, each evaporation opening comprises two evaporation sub-openings, each evaporation sub-opening comprises a first opening and a second opening, a size of the first opening is smaller than a size of the second opening, the first openings of the two evaporation sub-openings of each evaporation opening coincide, and the second openings are respectively positioned on different layouts of the mask.

At least one embodiment provides an evaporation apparatus comprising an evaporation mask, an evaporation source and the mask, the evaporation source and the mask are respectively arranged in the evaporation mask.

At least one embodiment provides a display device comprising a pattern formed using the mask.

For example, each evaporation opening comprises two evaporation sub-openings in a flared shape and communicating with each other.

BRIEF DESCRIPTION OF THE DRAWINGS

The embodiments of the present disclosure will be described in more detail below with reference to the accompanying drawings in order to enable those of ordinary skill in the art to more clearly understand the embodiments of the present disclosure, in which.

DETAILED DESCRIPTION

Technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, they may also include an electrical connection/coupling, directly or indirectly. The terms, "on," "under," "left," "right," or the like are only used to indicate relative position relationship, and when the position of the object which is described is changed, the relative position relationship may be changed accordingly.

The evaporation apparatus comprises an evaporation mask, an evaporation source and a fine metal mask (FMM) which are provided in the evaporation mask. The FMM is provided with a plurality of evaporation openings penetrating through the thickness of the FMM, each evaporation opening comprises two sub-evaporation openings, each sub-evaporation opening has a flared shape, each sub-evaporation opening is provided with a first opening and a second opening, the size of the first opening is smaller than the size of the second opening, the first openings of the two sub-evaporation openings are overlapped, and the second opening is positioned on different layouts of the FMM. When the FMM is manufactured, the metal master plate is processed from the two plates of the metal master plate through two patterning processes to form two evaporation sub-opening layers on the metal master plate, each evaporation sub-opening layer comprises a plurality of evaporation sub-openings, and the evaporation sub-openings of the two evaporation sub-opening layers communicate with each other in one to one correspondence to form a plurality of evaporation openings, and the FMM is obtained. The patterning process includes photoresist coating, exposure, development, etching and photoresist stripping.

An FMM is a mask used in the process of manufacturing an OLED display substrate. The number of evaporation openings per inch on FMM can be considered as the resolution of FMM, which directly affects the resolution of OLED display substrate. The current FMM manufacturing technology is difficult to achieve high resolution of FMM. Due to the limitations of manufacturing process, size of evaporation openings and morphology of evaporation openings, the current FMM has a maximum resolution of 500 ppi (Pixels Per Inch). Methods of manufacturing FMM include etching, electroforming and laser drilling. Etching and electroforming are two mainstream methods.

The process of manufacturing FMM by etching method comprises the following operations: providing a metal master plate with a lower stress; respectively coating a layer of photoresist (PR) on two layout surfaces of the metal master plate; and then exposing the two layers of photoresist by using a double-sided exposure machine, so that the two layers of photoresist form a fully exposed region and a non-exposed region, respectively, the fully exposed regions of the two layers of photoresist being aligned, and the non-exposed regions of the two layers of photoresist being aligned; then developing the exposed two layers of photoresist to remove the photoresist in the fully exposed regions; etching the regions on the metal master plate which are not shielded by the photoresist respectively from the two layout surfaces of the metal master plate by an etching process to form evaporation openings on the metal master plate; and finally stripping the photoresist on the metal master plate to obtain a FMM.

The process of manufacturing FMM by electroforming method comprises the following operations: firstly, providing a substrate; then spraying a conductive liquid on one surface of the substrate to form a conductive layer; then coating a layer of photoresist on the conductive layer; then sequentially exposing and developing the photoresist to obtain a photoresist pattern, the photoresist pattern comprising a photoresist reserved region and a photoresist completely removed region; then forming an electroforming pattern on the photoresist pattern by an electroforming process; finally removing the substrate, the conductive layer and the photoresist pattern, the reserved electroforming pattern being a FMM.

However, the inventor noticed that, in the process of manufacturing FMM by etching, the exposure positions of the two layers of photoresist are prone to offset with each other when a double-sided exposure is performed, which leads to the difficulty of precise alignment of the exposure positions of the two layers of photoresist, and further leads to a lower precision of the finally made FMM. In addition, the metal master plate is expensive, resulting in higher manufacturing cost of the FMM. an evaporation opening of FMM made by electroforming is usually cylindrical in shape, while the evaporation opening required by FMM is usually flare-shaped. So, it is difficult for a FMM made by an electroforming process to meet the evaporation requirements of the FMM.

In the mask and the manufacturing method, the evaporation apparatus and the display device provided by embodiments of the present disclosure, in the process of manufacturing the mask, a second photoresist pattern is formed by utilizing recessed region(s) on the metal layer, the second photoresist pattern and the first photoresist pattern below the metal layer have a self-alignment effect, the manufactured mask has a higher precision, and no metal master plate is required, so that the manufacturing cost of the mask is lower. In addition, flare-shaped evaporation sub-openings can be formed, and the mask can meet evaporation requirements. The scheme of the present disclosure is described in the following embodiments.

Figure 1:
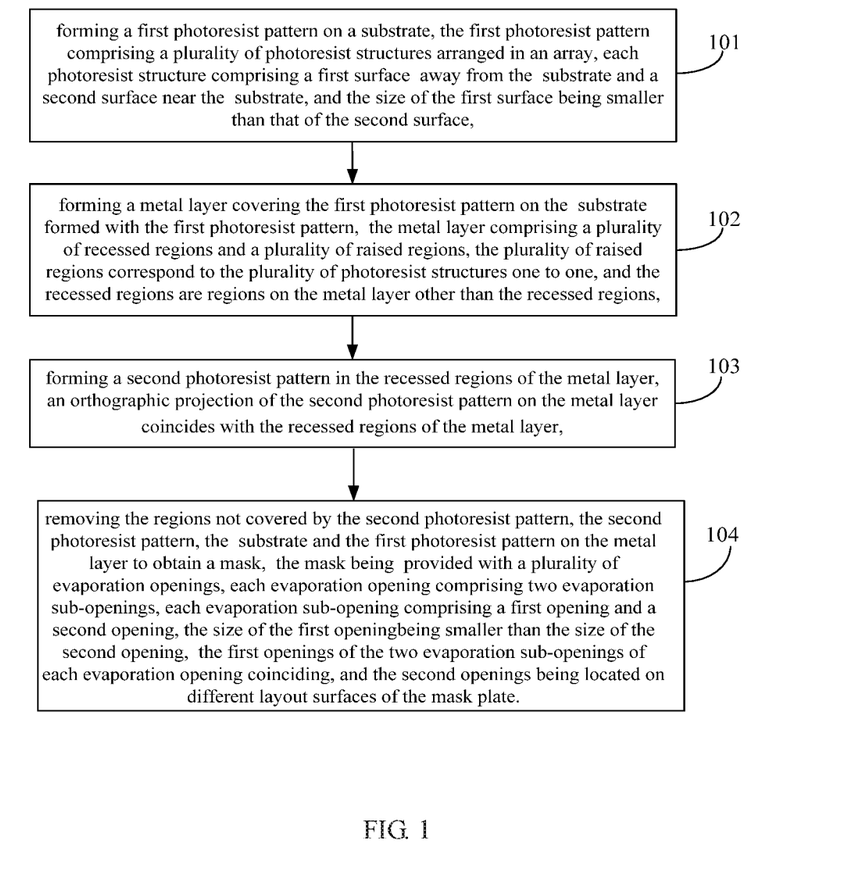
FIG. 1 is a flowchart of a method of manufacturing a mask provided by an embodiment of the present disclosure.

As shown in FIG. 1, a flowchart of a manufacturing method of a mask provided by an embodiment of the present disclosure is illustrated. The method may include the following operations:

Step 101, forming a first photoresist pattern on a substrate. The first photoresist pattern comprises a plurality of photoresist structures arranged in an array, each photoresist structure has a first surface far away from the substrate and a second surface near the substrate, and the size of the first surface is smaller than the size of the second surface.

Step 102: A metal layer covering the first photoresist pattern is formed on the substrate on which the first photoresist pattern is formed. The metal layer includes a a plurality of recessed regions and a plurality of raised regions, wherein the plurality of raised regions correspond to the plurality of photoresist structures one to one, and the recessed regions are regions other than the raised regions on the metal layer.

Step 103: A second photoresist pattern is formed in the recessed regions of the metal layer, and an orthographic projection of the second photoresist pattern on the metal layer coincides with the recessed regions of the metal layer.

Step 104: Removing the region not covered by the second photoresist pattern, the second photoresist pattern, the substrate and the first photoresist pattern on the metal layer to obtain a mask. The mask is provided with a plurality of evaporation openings, each evaporation opening comprising two evaporation sub-openings, each evaporation sub-opening comprising a first opening and a second opening, the size of each first opening being smaller than the size of each second opening, the first openings of the two evaporation sub-openings of each evaporation opening coinciding, and the second openings being positioned on different layout surfaces of the mask. For example, each evaporation opening comprises two evaporation sub-openings in a flared shape and communicating with each other.

According to the manufacturing method of the mask provided by the embodiment of the disclosure, in the process of manufacturing the mask, the second photoresist pattern is formed by utilizing the recessed regions on the metal layer, and the second photoresist pattern and the first photoresist pattern have a self-alignment effect, so that the evaporation sub-openings formed based on the first photoresist pattern and the evaporation sub-openings formed based on the second photoresist pattern can be accurately aligned, and the alignment accuracy of the two evaporation sub-openings of each evaporation opening is higher, so that the problem of lower accuracy of the mask caused by lower alignment accuracy can be solved, and the accuracy of the mask can be improved.

For example, step 103 includes forming a second photoresist pattern in the recessed regions of the metal layer by an ink jet printing process or a coating process.

For example, the method further includes forming a conductive adhesive layer covering the first photoresist pattern on the substrate on which the first photoresist pattern is formed before step 102;

Correspondingly, step 102 includes forming a metal layer covering the conductive adhesive layer on the substrate on which the conductive adhesive layer is formed by an electroforming process.

The method further includes removing the conductive adhesive layer after step 103.

For example, the two evaporation sub-openings of each evaporation opening include a first evaporation sub-opening and a second evaporation sub-opening.

Step 104 includes: removing a region on the metal layer not covered by the second photoresist pattern through a wet etching process to form a first evaporation sub-opening layer on the metal layer. The first evaporation sub-opening layer comprises a plurality of first evaporation sub-openings corresponding to a plurality of photoresist structures one to one;

Removing the second photoresist pattern by a photoresist stripping process.

Stripping the substrate.

Removing the first photoresist pattern through a photoresist stripping process to form a second evaporation sub-opening layer on the metal layer. The second evaporation sub-opening layer comprises a plurality of second evaporation sub-openings corresponding to a plurality of photoresist structures one to one.

For example, removing the conductive adhesive layer includes following operations.

After removing the regions on the metal layer not covered by the second photoresist pattern and before removing the second photoresist pattern, removing the regions on the conductive adhesion layer not covered by the metal layer through a wet etching process;

After removing the first photoresist pattern, the remaining conductive adhesion layer is removed by a wet etching process.

For example, the conductive adhesive layer is made of at least one of metallic silver and metallic molybdenum.

For example, the metal layer has a thickness ranging from about 5 microns to about 50 microns, and the ratio of the thickness of the first photoresist pattern to the thickness of the metal layer ranges from about ⅓ to ⅔.

For example, the first photoresist pattern is made of material including epoxy photoresist, such as SU8 series photoresist. SU8 is an epoxy negative photoresist based on epoxy SU-8 resin (from the rubber industry), due to the average of one molecule containing 8 epoxy groups, it is called SU-8, such as SU8-5, SU-8-50 series from Microlithography Chemical.

All the above-mentioned exemplary technical solutions can be combined in any way to form alternative embodiments of the present disclosure, which will not be repeated here.

Figure 2:
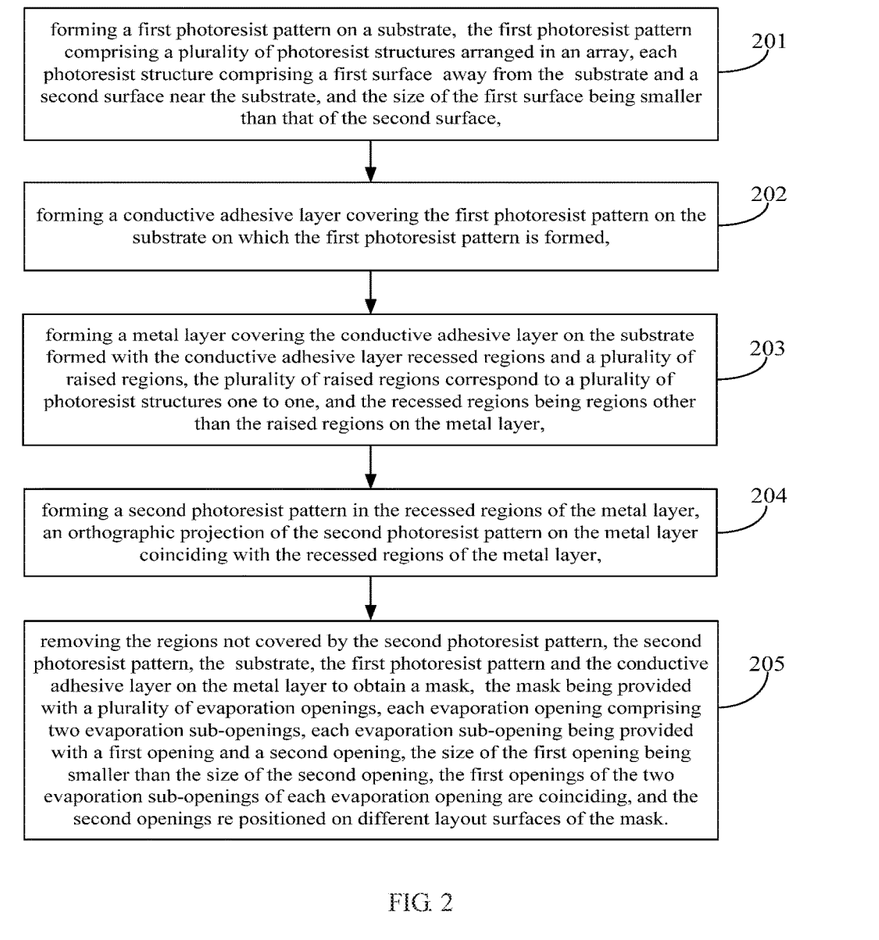
FIG. 2 is a method flow chart of another mask manufacturing method provided by an embodiment of the present disclosure.

As shown in FIG. 2, a flowchart of another mask manufacturing method provided by an embodiment of the present disclosure is illustrated. The method may include the following operations.

Step 201, forming a first photoresist pattern on a substrate. The first photoresist pattern comprises a plurality of photoresist structures arranged in an array, each photoresist structure includes a first surface far away from the substrate and a second surface near the substrate, and the size of the first surface is smaller than the size of the second surface.

Figure 3:
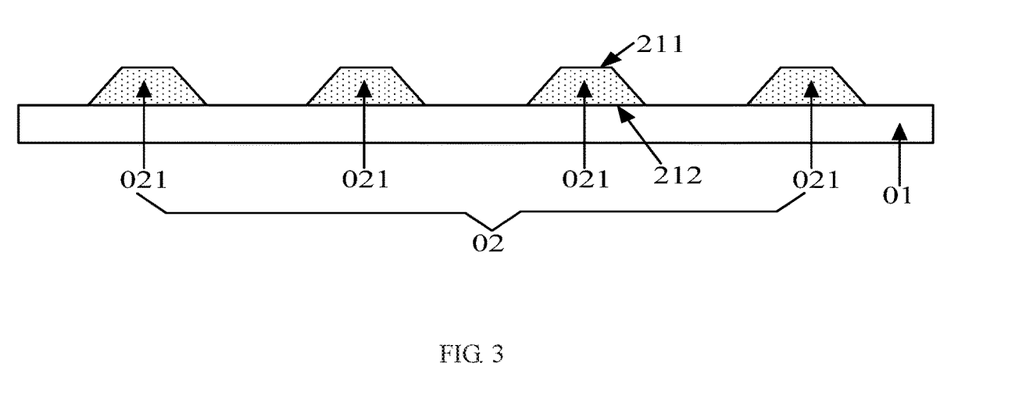
FIG. 3 is a schematic diagram after forming a first photoresist pattern on a substrate according to an embodiment of the present disclosure.

As shown in FIG. 3, a schematic diagram after forming a first photoresist pattern 02 on a substrate 01 according to an embodiment of the present disclosure is illustrated. As shown in FIG. 3, the photoresist pattern 02 includes a plurality of photoresist structures 021 (only 4 are shown in FIG. 3, however, the present embodiments are not limited thereto) arranged in an array. Each photoresist structure 021 include a first surface 211 away from the substrate 01 and a second surface 212 near the substrate 01, and the size of the first surface 211 is smaller than the size of the second surface 212. In the embodiment of the present disclosure, the second surface 212 of each photoresist structure 021 is also the surface of the photoresist structure 021 that is in contact with the substrate 01. For example, the photoresist structure 021 may be a frustum. Depending on the photoresist structure 021, the size of each of the first surface 211 and the second surface 212 may be the side length, perimeter or area of the surface, and the embodiments of the present disclosure are not limited thereto.

The substrate 01 may be a substrate made of a material having certain firmness, such as glass, quartz or transparent resin, for example, the substrate 01 is a glass substrate. The first photoresist pattern 02 may be made of a positive photoresist or a negative photoresist, for example, the first photoresist pattern 02 may be an epoxy photoresist, such as SU8 photoresist. The thickness of the first photoresist pattern 02 may be determined according to the thickness of the mask to be fabricated. For example, the thickness of the first photoresist pattern 02 may be about ⅓ to ⅔ of the thickness of the mask to be fabricated. The thickness of the first photoresist pattern 02 may also be referred to be the height of the photoresist structure 021, but the embodiments of the present disclosure are not limited thereto.

For example, a layer of SU8 photoresist can be coated on the substrate 01 by a coating process to obtain a photoresist layer, and then the photoresist layer is sequentially exposed and developed to obtain a photoresist pattern 02 as shown in FIG. 3.

Step 202: forming a conductive adhesive layer covering the first photoresist pattern on the substrate on which the first photoresist pattern is formed.

Figure 4:
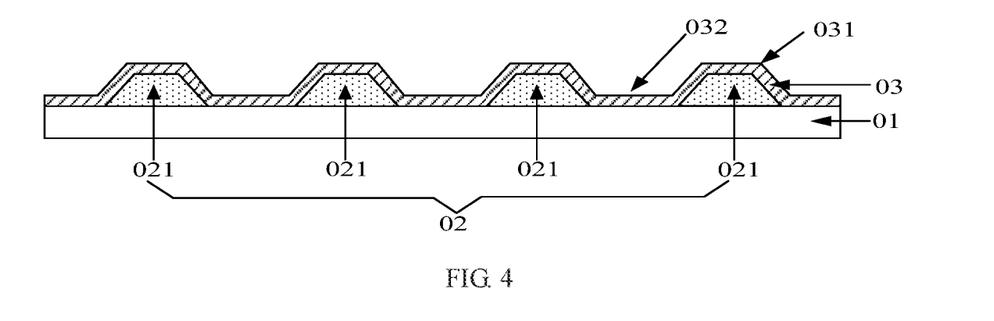
FIG. 4 is a schematic diagram after forming a conductive adhesive layer on a substrate formed with a first photoresist pattern according to an embodiment of the present disclosure.

As shown in FIG. 4, a schematic diagram after a conductive adhesive layer 03 is formed on a substrate 01 on which a first photoresist pattern 02 is formed according to an embodiment of the present disclosure is illustrated. The conductive adhesive layer 03 includes a plurality of recessed regions 032 and a plurality of raised regions 031, in other words, the conductive adhesive layer 03 includes island-like structures, the plurality of raised regions 031 correspond to the plurality of photoresist structures 021 one to one, and the recessed regions 032 are regions of the conductive adhesive layer 03 other than the raised regions 031. The conductive adhesive layer 03 is made of at least one of metal silver (Ag) and metal molybdenum (Mo), and the thickness of the conductive adhesive layer 03 may be tens to hundreds of nanometers, for example, about 10-500 nm.

For example, the conductive adhesive layer 03 can be obtained by spraying a layer of metal Ag solution on the substrate 01 on which the first photoresist pattern 02 is formed by a spraying process and drying it; or, a layer of metal Mo is deposited as the conductive adhesion layer 03 on the substrate 01 on which the first photoresist pattern 02 is formed by processes, such as magnetron sputtering, thermal evaporation, plasma enhanced chemical evaporation (PECVD), etc. However, the embodiments of the present disclosure are not limited thereto, and the conductive adhesive layer 03 may be formed by other processes.

In step 203, forming a metal layer covering the conductive adhesive layer on the substrate formed with the conductive adhesive layer by an electroforming process. The metal layer includes a plurality of recessed regions and a plurality of raised regions, the plurality of raised regions correspond to the plurality of photoresist structures one to one, and the recessed regions are regions on the metal layer other than the raised regions.

Figure 5:
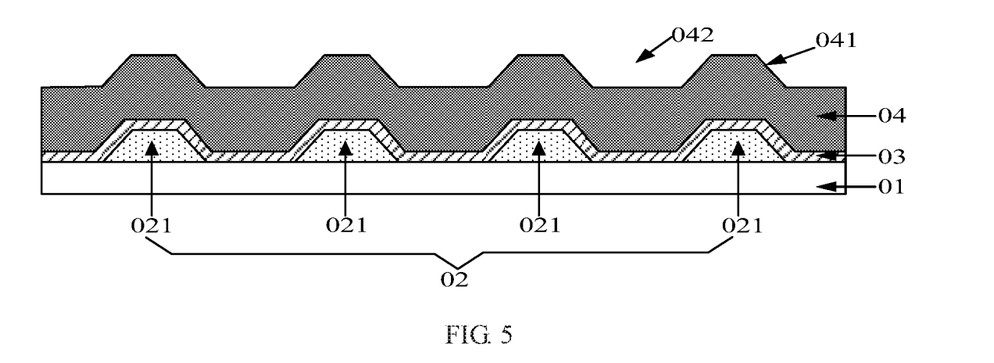
FIG. 5 is a schematic diagram after forming a metal layer on a substrate formed with a conductive adhesive layer according to an embodiment of the present disclosure.

As shown in FIG. 5, a schematic diagram after a metal layer 04 is formed on a substrate 01 on which a conductive adhesive layer 03 is formed according to an embodiment of the present disclosure is illustrated. The metal layer 04 includes a plurality of recessed regions 042 and a plurality of raised regions 041, in other words, the metal layer 04 includes island-like structures, the plurality of raised regions 041 correspond to the plurality of photoresist structures 021 one to one, and the recessed regions 042 are the regions other than the raised regions 41 on the metal layer 04. The height difference between each raised region 041 and each recessed region 042 may be about ⅓ to ⅔ of the thickness of the metal layer 04. The height difference between each raised region 041 and each recessed region 042 may be the distance between the upper surface of the raised region 041 and the upper surface of the recessed region 042. The upper surface of the raised region 041 is the surface of the raised region 041 away from the substrate 01, and the upper surface of the recessed region 042 is the surface of the recessed region 042 away from the substrate 01. The metal layer 04 is made of a metal with a very small coefficient of thermal expansion, such as invar alloy (a nickel-iron alloy), metal nickel, and the like, but the embodiments of the present disclosure are not limited thereto. The thickness of the metal layer 04 may range from about 5 microns to about 50 microns, and the ratio of the thickness of the first photoresist pattern 02 to the thickness of the metal layer 04 may range from about ⅓ to about ⅔.

For example, the substrate shown in FIG. 4 can be placed in an electroforming tank containing a metal electroforming solution, and the metal electroforming solution is energized, under the action of current, metal ions in the metal electroforming solution move toward the conductive adhesion layer 03, and are reduced to metal under the action of the conductive adhesion layer 03 and deposited on the conductive adhesion layer 03. When the metal deposited on the conductive adhesion layer 03 reaches a certain thickness, the power supply to the metal electroforming solution is stopped to obtain the substrate shown in FIG. 5, and the metal deposited on the conductive adhesion layer 03 is the metal layer 04.

Step 204: Forming a second photoresist pattern in the recessed regions of the metal layer, with an orthographic projection of the second photoresist pattern on the metal layer coinciding with the recessed regions of the metal layer.

Figure 6:
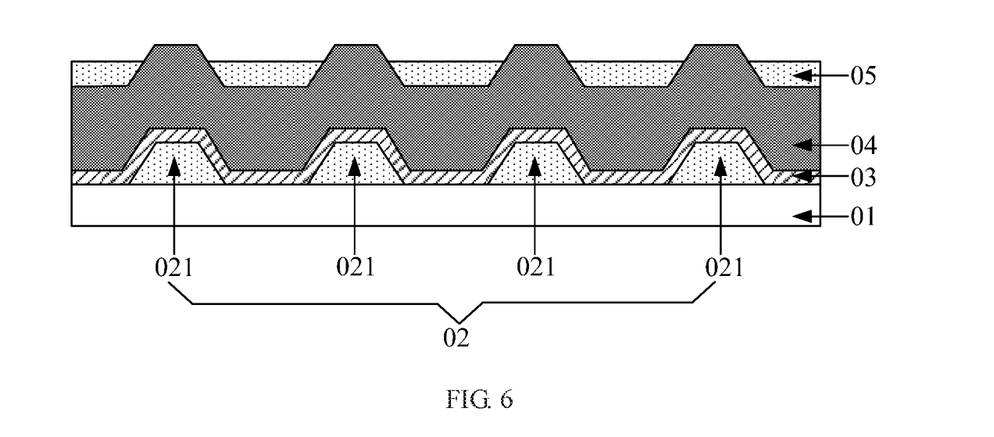
FIG. 6 is a schematic diagram after forming a second photoresist pattern in recessed regions according to an embodiment of the present disclosure.

As shown in FIG. 6, a schematic diagram after the second photoresist pattern 05 is formed in the recessed regions of the metal layer 04 according to an embodiment of the present disclosure is illustrated. An orthographic projection of the second photoresist pattern 05 on the metal layer 04 coincides with the recessed regions of the metal layer 04, that is, the second photoresist pattern 05 completely coincides with the recessed regions of the metal layer 04. The second photoresist pattern 05 may be made of a positive photoresist, or a negative photoresist.

For example, the second photoresist pattern 05 may be formed in the recessed regions of the metal layer 04 by an ink printing process or a coating process. For example, the second photoresist pattern 05 is obtained by printing photoresist in the recessed regions of the metal layer 04 through an ink jet printing process, or the second photoresist pattern 05 is obtained by coating photoresist in the recessed regions of the metal layer 04 through a coating process.

Step 205: Removing the regions not covered by the second photoresist pattern, the second photoresist pattern, the substrate, the first photoresist pattern and the conductive adhesive layer on the metal layer to obtain a mask. The mask is provided with a plurality of evaporation openings. For example, each evaporation opening comprises two evaporation sub-openings in a flared shape. Each evaporation sub-opening comprises a first opening and a second opening, the size of each first opening is smaller than the size of each second opening, the first openings of the two evaporation sub-openings of each evaporation opening are overlapped, and the second openings are positioned on different layout surfaces of the mask. The two evaporation sub-openings of each evaporation opening include a first evaporation sub-opening and a second evaporation sub-opening.

Figure 7:
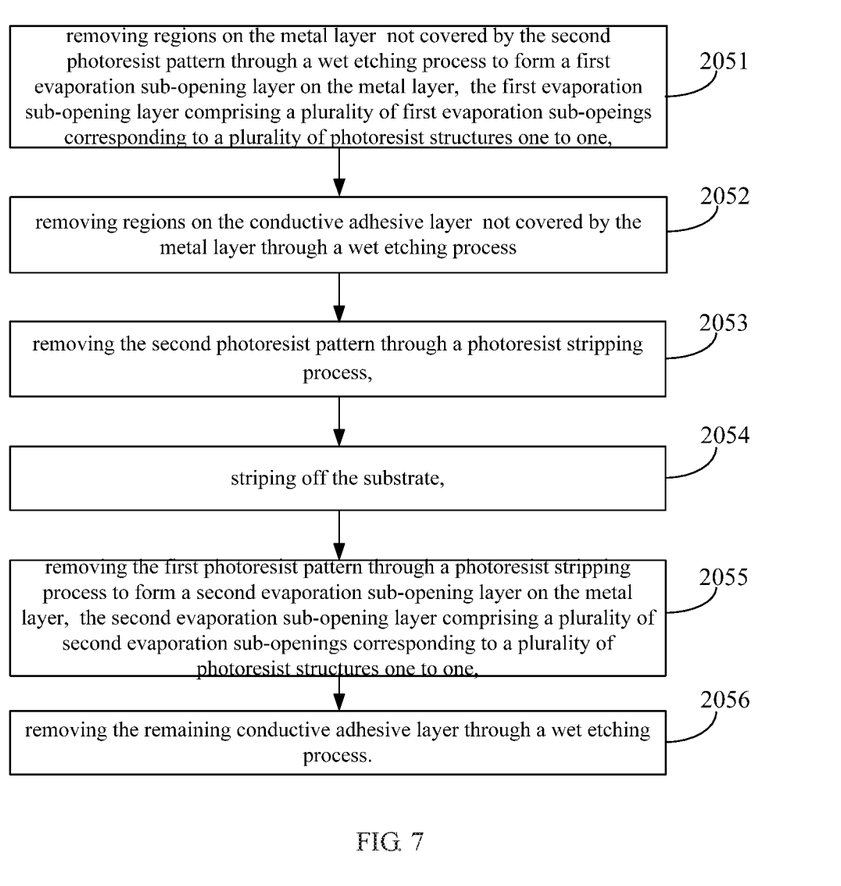
FIG. 7 is a flowchart of a method for removing regions on a metal layer not covered by a second photoresist pattern, a second photoresist pattern, a substrate, a first photoresist pattern and a conductive adhesive layer provided by an embodiment of the present disclosure.

As shown in FIG. 7, a flow chart of a method for removing regions on a metal layer not covered by a second photoresist pattern, a second photoresist pattern, a substrate, a first photoresist pattern and a conductive adhesive layer provided by an embodiment of the present disclosure is illustrated. As shown in FIG. 7, the method includes following operations.

Sub-step 2051: Removing the regions on the metal layer not covered by the second photoresist pattern by a wet etching process to form a first evaporation sub-opening layer on the metal layer. The first evaporation sub-opening layer comprises a plurality of first evaporation sub-openings corresponding to a plurality of photoresist structures one to one.

Figure 8:
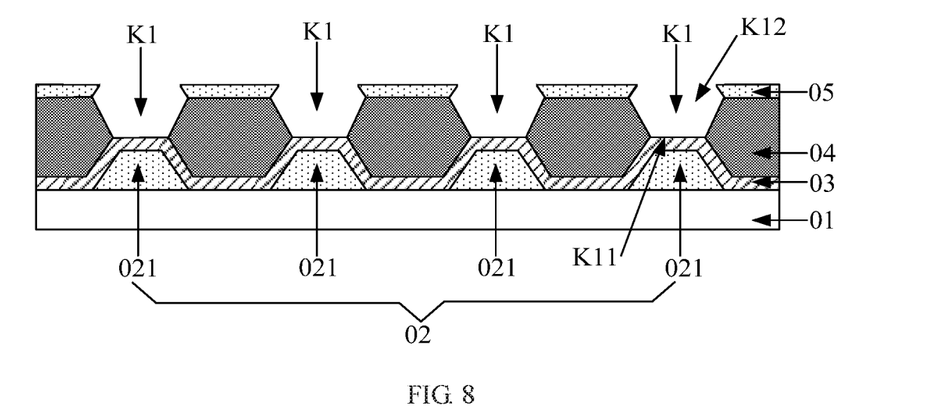
FIG. 8 is a schematic diagram after removing the region on the metal layer not covered by the second photoresist pattern according to an embodiment of the present disclosure.

As shown in FIG. 8, a schematic diagram after regions on the metal layer 04 not covered by the second photoresist pattern 05 are removed by a wet etching process according to an embodiment of the present disclosure is illustrated. After removing the regions on the metal layer 04 not covered by the second photoresist pattern 05, a first evaporation sub-opening layer is formed on the metal layer 04, the first evaporation sub-opening layer comprising a plurality of first evaporation sub-openings K1 corresponding to the plurality of photoresist structures 021 one to one, each first evaporation sub-opening K1 including a first opening K11 and a second opening K12, the size of each first opening K11 being smaller than the size of each second opening K12, the first opening K11 being located in the metal layer 04, and the second opening K12 being located on the surface of the metal layer 04. The orthographic projection of each first evaporation sub-opening K1 on the substrate 01 may coincide with the orthographic projection of the corresponding photoresist structures 021 on the substrate 01. It is noted that a part that comes into contact with the etching medium (e.g., etching liquid) is etched first in the etching process. So, the first evaporation sub-opening K1 is formed after the regions on the metal layer 04 not covered by the second photoresist pattern 05 are removed by the wet etching process. For example, each first evaporation sub-opening K1 has a flared shape.

Step 2052: Removing the regions on the conductive adhesive layer not covered by the metal layer through a wet etching process.

Figure 9:
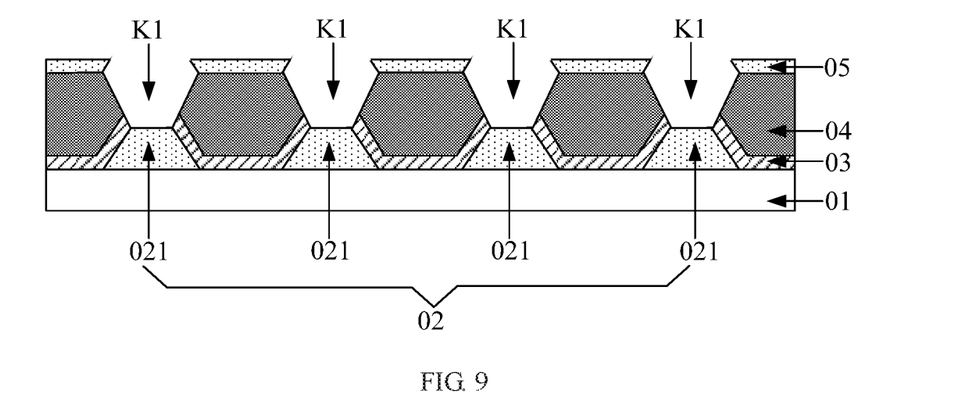
FIG. 9 is a schematic diagram after removing regions on the conductive adhesive layer not covered by the metal layer according to an embodiment of the present disclosure.

As shown in FIG. 9, a schematic diagram after regions on the conductive adhesive layer 03 not covered by the metal layer 04 are removed by a wet etching process according to an embodiment of the present disclosure is illustrated. The regions on the conductive adhesive layer 03 not covered by the metal layer 04 can also be considered as corresponding regions of the photoresist structures 021 on the conductive adhesive layer 03.

Step 2053: Removing the second photoresist pattern by a photoresist stripping process.

Figure 10:
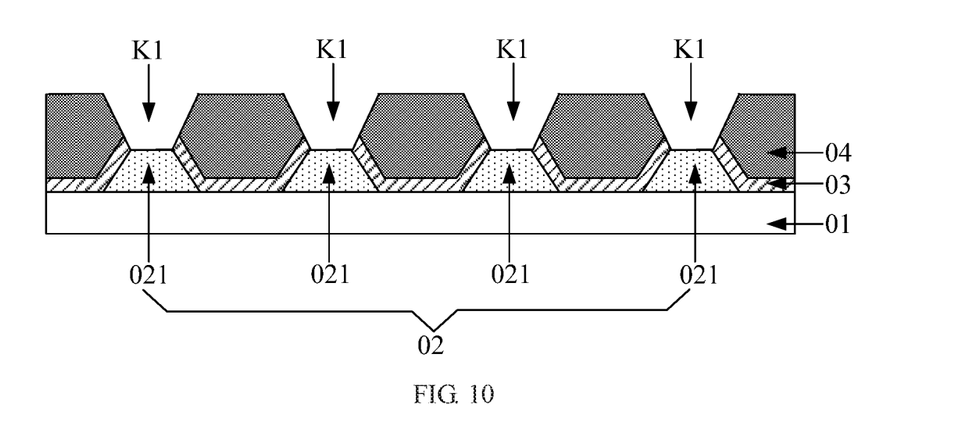
FIG. 10 is a schematic diagram after removing the second photoresist pattern according to an embodiment of the present disclosure.

As shown in FIG. 10, a schematic diagram after the second photoresist pattern 05 is removed through a photoresist stripping process provided by the embodiment of the present disclosure is illustrated. The photoresist stripping process may be any process capable of removing photoresist, such as ashing process, developing process, dry etching process, etc.

Figure 11:
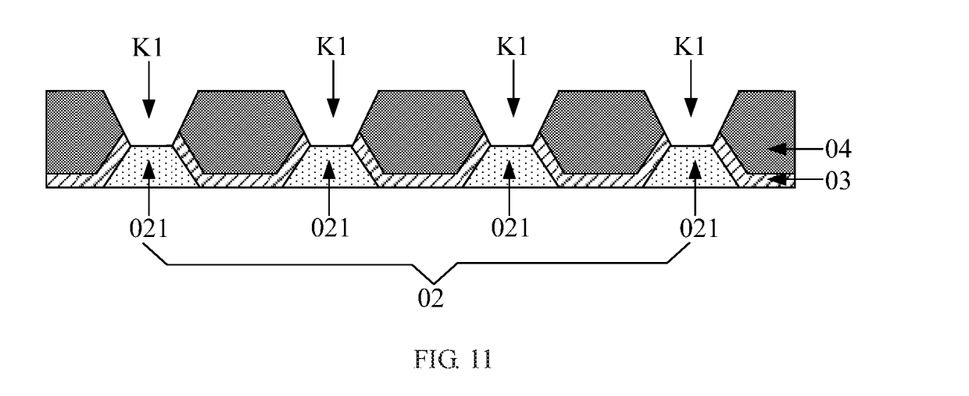
FIG. 11 is a schematic diagram after stripping the substrate according to an embodiment of the present disclosure.

Sub-step 2054: Stripping off the substrate. The schematic diagram after stripping off the substrate 01 is shown in FIG. 11.

Sub-step 2055: Removing the first photoresist pattern by a photoresist stripping process to form a second evaporation sub-opening layer on the metal layer. The second evaporation sub-opening layer includes a plurality of second evaporation sub-openings corresponding to a plurality of photoresist structures one to one.

Figure 12:
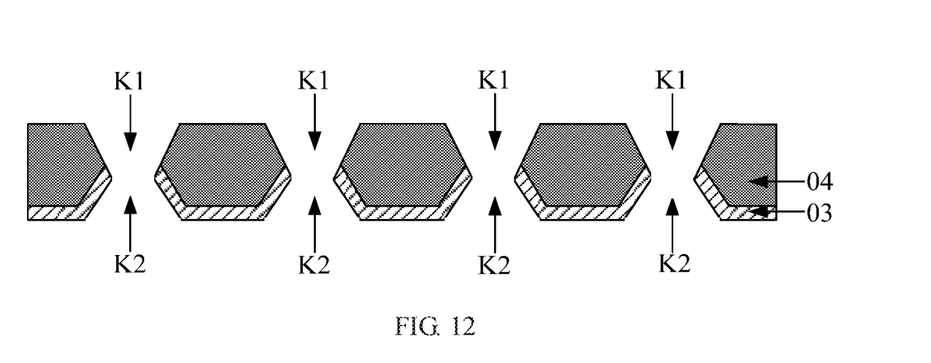
FIG. 12 is a schematic diagram after removing the first photoresist pattern according to an embodiment of the present disclosure.

As shown in FIG. 12, a schematic diagram after the first photoresist pattern 02 is removed through a photoresist stripping process according to an embodiment of the present disclosure is illustrated. After the first photoresist pattern 02 is removed, a second evaporation sub-opening layer is formed on the metal layer 04. The second evaporation sub-opening layer includes a plurality of second evaporation sub-openings K2 corresponding to a plurality of photoresist structures 021 one to one. The photoresist stripping process can be any process capable of removing photoresist, such as ashing process, developing process, or dry etching process, etc.

Sub-step 2056: Removing the remaining conductive adhesive layer by wet etching process.

Figure 13:
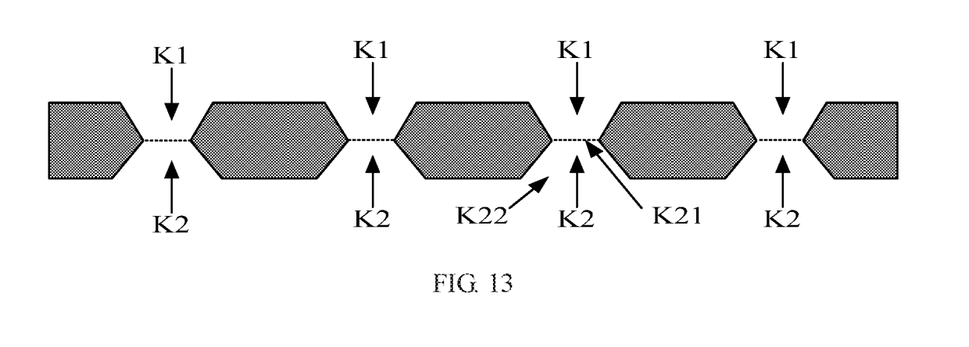
FIG. 13 is a schematic diagram after removing the remaining conductive adhesive layer provided by an embodiment of the present disclosure.

As shown in FIG. 13, a schematic diagram after the remaining conductive adhesive layer 03 is removed by a wet etching process according to an embodiment of the present disclosure is illustrated. It is noted that the second evaporation sub-opening K2 formed in sub-step 2055 may be an initial evaporation sub-opening, after the remaining conductive adhesive layer 03 is removed, the initial evaporation sub-opening is enlarged to obtain the final second evaporation sub-opening K2, thereby obtaining the mask shown in FIG. 13.

Figure 14:
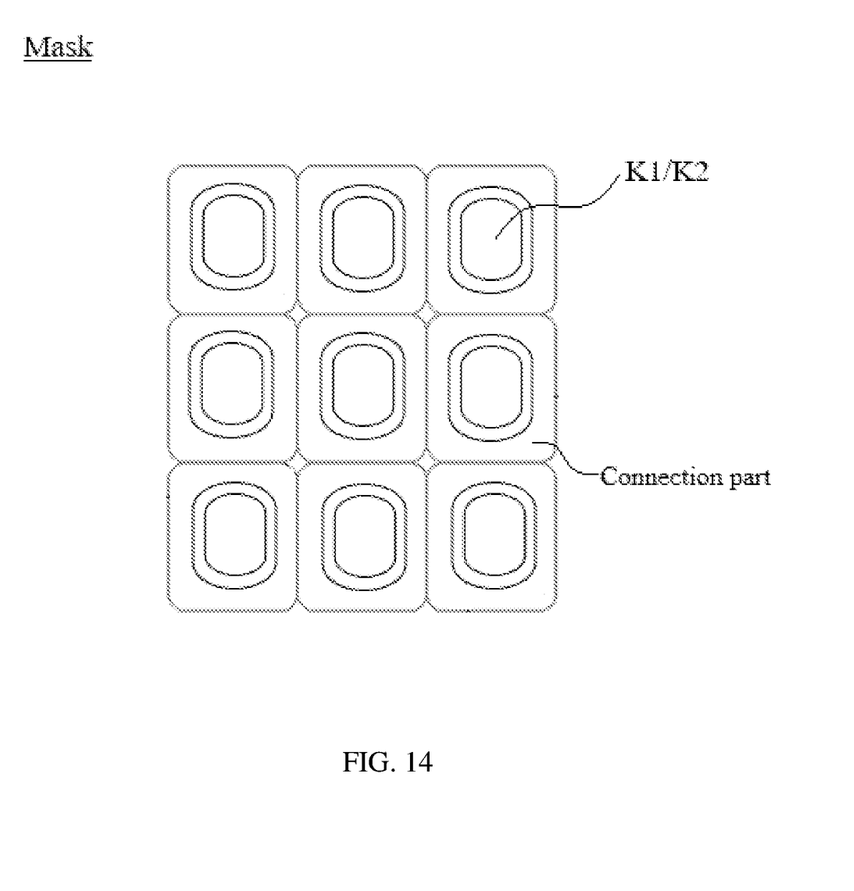
FIG. 14 is a schematic plan view of a mask with sub-openings provided by an embodiment of the present disclosure.

As shown in FIG. 13, each second evaporation sub-opening K2 includes a first opening K21 and a second opening K22, the first opening K21 being smaller than the second opening K22, the first opening K21 being located in the metal layer 04, and the second opening K22 being located on the surface of the metal layer 04. The plurality of first evaporation sub-openings K1 and the plurality of second evaporation sub-openings K2 communicate with each other in one-to-one correspondence to form a plurality of evaporation openings, and the first opening K11 of the first evaporation sub-opening K1 forming each evaporation opening coincides with the first opening K21 of the second evaporation sub-opening K2 forming the evaporation opening. For example, each second evaporation sub-opening K2 has a flared shape. FIG. 14 shows a schematic plan view of a mask formed by an embodiment of the present application.

In the embodiment of the present disclosure, the shape of the cross-section of each evaporation opening may be circular or polygonal, the cross-section of each evaporation opening is perpendicular to the axis of the evaporation opening, or the cross-section of each evaporation opening is parallel to the layout face of the mask.

It is noted that the thickness of a film layer refers to the size of the film layer in a direction perpendicular to the surface of the substrate herein. For example, the thickness of the first photoresist pattern 02 is a dimension of the first photoresist pattern 02 in a direction perpendicular to the surface of the substrate 01; the thickness of the conductive adhesive layer 03 is a dimension of the conductive adhesive layer 03 in a direction perpendicular to the surface of the substrate 01; and the thickness of each of other film layers is the same as these definitions and will not be repeated here.

It is also be noted that the sequence of steps in the mask manufacturing method provided by the embodiments of the present disclosure can be appropriately adjusted, and the operations can be correspondingly increased or decreased according to various situations. For example, the above sub-step 2051 and sub-step 2052 can be performed separately or as one step. The order of the above sub-step 2053 and the sub-step 2054 can be exchanged, and the above sub-step 2053 and the sub-step2 055 can be executed in any order or simultaneously. One of ordinary skill in the art can readily conceive various methods within the scope disclosed in this disclosure, and they should all fall within the scope of this disclosure, so they will not be repeated here.

According to the manufacturing method of the mask provided by the embodiments of the disclosure, in the process of manufacturing the mask, the second photoresist pattern is formed by utilizing recessed regions on the metal layer, and the second photoresist pattern and the first photoresist pattern have a self-alignment effect, so that each of the evaporation sub-openings formed based on the first photoresist pattern and each of the evaporation sub-openings formed based on the second photoresist pattern can be accurately aligned, and the alignment accuracy of the two evaporation sub-openings forming the evaporation opening is higher. In this way, the problem of lower accuracy of the mask caused by lower alignment accuracy can be solved, and the accuracy of the mask can be improved. The manufacturing method of the mask provided by the embodiments of the disclosure uses the metal layer to make the mask, which does not need to use a metal master plate, and can reduce the manufacturing cost of the mask. In addition, the main body of the mask (i.e. the metal layer used to form the mask) is formed by an electroforming process, which allows the surface roughness of the finally formed mask to be low, and allows the mask to have a small stress, while its hardness is increased by about 30% compared with the metal master plate, and to have a long service life.

An embodiment of the present disclosure also provides a mask manufactured by the method provided in the embodiments shown in FIG. 1 or FIG. 2, the mask can be FMM, and its structure can be the same as shown in FIG. 13. As shown in FIG. 13, the mask includes a plurality of evaporation openings, each evaporation opening including two evaporation sub-openings. Each evaporation sub-opening including a first opening and a second opening, the size of the first opening is smaller than the size of the second opening, the first openings of the two evaporation sub-openings of each evaporation opening overlap, and the second openings are located on different layout surfaces of the mask, respectively. The two evaporation sub-openings of each evaporation opening may be the first evaporation sub-opening K1 and the second evaporation sub-opening K2 in FIG. 13.

An embodiment of the disclosure also provides an evaporation apparatus, which comprises an evaporation mask, an evaporation source and a mask as shown in FIG. 13. The evaporation source and the mask are respectively arranged in the evaporation mask. The evaporation apparatus may also include other structures, and the embodiments of the present disclosure will not be described here.

An embodiment of the present disclosure also provides a display device including a pattern formed by using the mask as shown in FIG. 13, which may be an electrode pattern or a light-emitting layer pattern, etc., and the embodiments of the present disclosure are not limited thereto.

For example, the display device can be any product or component with display function, such as a liquid crystal panel, an OLED panel, electronic paper, a mobile phone, a tablet computer, a television, a display, a notebook computer, a digital photo frame or a navigator.

The foregoing is only the exemplary embodiments of the present disclosure, and the scope of the present disclosure is not limited thereto. A person of ordinary skill in the art can make various changes and modifications without departing from the present disclosure, and such changes and modifications shall fall into the scope of the present disclosure.

What is claimed is:

1. A method of manufacturing a mask, comprising:
   providing a substrate;
   forming a first photoresist pattern on the substrate, the first photoresist pattern comprising a plurality of photoresist structures arranged in an array, each photoresist structure comprising a first surface far away from the substrate and a second surface near the substrate, and a size of the first surface being smaller than a size of the second surface;

forming a conductive adhesive layer covering the first photoresist pattern on the substrate formed with the first photoresist pattern;

forming a metal layer covering the conductive adhesive layer on the first photoresist pattern, the metal layer comprising a plurality of raised regions and a plurality of recessed regions other than the plurality of raised regions, the plurality of raised regions corresponding to the plurality of photoresist structures one to one;

forming a second photoresist pattern in the recessed regions of the metal layer, an orthographic projection of the second photoresist pattern on the metal layer overlapping with the recessed region; and removing regions of the metal layer not covered by the second photoresist pattern;

removing regions of the conductive adhesive layer not covered by the metal layer by a wet etching process;

removing the second photoresist pattern to form a plurality of first evaporation sub-openings corresponding to the plurality of photoresist structure one to one;

stripping off the substrate;

removing the first photoresist pattern; and removing the remaining conductive adhesive layer to form a plurality of second evaporation sub-openings corresponding to the plurality of photoresist structures one to one, so as to obtain a mask, wherein the mask comprises a plurality of evaporation openings, each evaporation opening comprising one of the plurality of first evaporation sub-openings and a corresponding one of the plurality of second evaporation sub-openings, the first evaporation sub-opening and the corresponding second evaporation sub-opening of the each evaporation opening are flared shaped and communicate with each other through a same smaller size bottom aperture.

2. The method according to claim 1, wherein the forming of the second photoresist pattern in the recessed region of the metal layer comprises:

forming the second photoresist pattern in the recessed regions of the metal layer by an ink jet printing process or a coating process.

3. The method according to claim 1, further comprising:

the forming of the metal layer covering the first photoresist pattern on the substrate formed with the first photoresist pattern comprises: forming the metal layer covering the conductive adhesion layer on the substrate on which the conductive adhesion layer is formed by an electroforming process.

4. The method according to claim 3, wherein the conductive adhesive layer is made of at least one of metallic silver and metallic molybdenum.

5. The method according to claim 1, wherein the metal layer has a thickness ranging from about 5 microns to about 50 microns, and a ratio of thickness of the first photoresist pattern to the thickness of the metal layer ranges from about ⅓ to about ⅔.

6. The method according to claim 1, wherein the plurality of recessed regions and the plurality of raised regions are arranged alternately.

\* \* \* \* \*